United States Patent
Zou et al.

(10) Patent No.: US 10,738,379 B2
(45) Date of Patent: Aug. 11, 2020

(54) ASSEMBLY AND APPARATUS FOR VAPOR DEPOSITION

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Qinghua Zou, Beijing (CN); Shupeng Guo, Beijing (CN); Bin Bu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefeim Anhui (CN)

( * ) Notice: Subject to any disclaimer, the term of this patent is extended or adjusted under 35 U.S.C. 154(b) by 337 days.

(21) Appl. No.: 15/840,687

(22) Filed: Dec. 13, 2017

(65) Prior Publication Data
US 2018/0274082 A1    Sep. 27, 2018

(30) Foreign Application Priority Data
Mar. 22, 2017    (CN) .......................... 2017 1 0174567

(51) Int. Cl.
| | | |
|---|---|---|
| C23C 14/24 | (2006.01) | |
| H01L 51/56 | (2006.01) | |
| C23C 14/12 | (2006.01) | |
| C23C 16/455 | (2006.01) | |
| H01L 51/00 | (2006.01) | |

(52) U.S. Cl.
CPC .............. *C23C 14/24* (2013.01); *C23C 14/12* (2013.01); *C23C 14/243* (2013.01); *C23C 16/45578* (2013.01); *H01L 51/56* (2013.01); *H01L 51/001* (2013.01)

(58) Field of Classification Search
CPC .................................................. C23C 14/243
See application file for complete search history.

(56) References Cited

U.S. PATENT DOCUMENTS

| | | | | |
|---|---|---|---|---|
| 4,027,093 A | * | 5/1977 | Kibbish ................ | C23C 14/246 373/15 |
| 2005/0147753 A1 | * | 7/2005 | Smith ..................... | C23C 14/12 427/249.1 |

* cited by examiner

*Primary Examiner* — Joseph A Miller, Jr.
(74) *Attorney, Agent, or Firm* — Nath, Goldberg & Meyer; Joshua B. Goldberg

(57) ABSTRACT

An assembly and a device for vapor deposition are provided in this disclosure, an assembly includes a cell and a housing, the cell is accommodated in the housing, the gaseous materials to be vapor deposited eject from the housing and are vapor deposited onto the substrate. The housing is capable of rotating relative to the cell. The film layer structure can be obtained by controlling the angles of rotation of the housing. Single film layer as well as the composite film layer with various changes of doping ratio can be formed on the substrate of the assembly and the device for vapor deposition in this disclosure.

16 Claims, 3 Drawing Sheets

ASSEMBLY AND APPARATUS FOR VAPOR DEPOSITION

CROSS-REFERENCE TO RELATED APPLICATION

This present application claims priority to Chinese Patent Application No. 201710174567.4, filed on Mar. 22, 2017 in State Intellectual Property Office, the disclosure of which is incorporated herein by reference.

TECHNICAL FIELD

This disclosure relates to the field of display technologies, and in particular to an assembly and an apparatus for vapor deposition.

BACKGROUND

At present, the vapor deposition technology is used in the mainstream preparation process of Organic Light-Emitting Diode (OLED). The vapor deposition technology mainly utilizes the principle of thermal evaporation of organic materials, wherein the organic materials are filled into the assembly for vapor deposition and then heated in a vacuum environment, so that the organic materials in a solid state can be melted and volatilized or sublimated into a gaseous state. Subsequently, a gas stream of the organic materials is deposited on a glass substrate to form a plurality of layers of organic films that are used to prepare an OLED device.

SUMMARY

In view of the disadvantages in the prior art, there is provided an assembly and apparatus for vapor deposition for at least partially solving the problems of the inconvenient utilization of the assembly for vapor deposition and the high manufacturing cost of display devices.

The embodiments of this disclosure provide the following solutions:

In an aspect of this disclosure, there is provided an assembly for vapor deposition including a housing and a cell accommodated in the housing and configured to receive materials to be vapor-deposited, wherein the housing is capable of rotating relative to the cell and ejecting the materials to be vapor-deposited in a gaseous state.

In a preferably embodiment of the present disclosure, the cell is in a cylindrical shape.

In a preferably embodiment of the present disclosure, the cell includes an arc-shaped main body and an upper cover, the main body is connected to the upper cover to form the cylindrical shape; and the upper cover is provided with a plurality of openings on its top.

In a preferably embodiment of the present disclosure, an inner wall of the housing has a circular cross section.

In a preferably embodiment of the present disclosure, the cell and the housing are arranged at an interval in radial a direction.

In a preferably embodiment of the present disclosure, the assembly for vapor deposition further includes a bearing collar provided in the interval between the cell and the housing.

In a preferably embodiment of the present disclosure, the housing is in a cylindrical shape comprising seal caps, a main body portion and a plurality of air outlets; the air outlets are protruded from an outer wall of the main body portion and arranged in an axial direction of the main body portion; and the seal caps are connected to and close both ends of the main body portion.

In a preferably embodiment of the present disclosure, the seal caps are threaded to both ends of the main body portion.

In a preferably embodiment of the present disclosure, the housing is capable of rotating by a maximum of 60 degrees from a reference position about its axis; and the reference position is a position of the housing when the air outlets are oriented vertically upward.

In a preferably embodiment of the present disclosure, the assembly for vapor deposition further includes a bearing and an arc-shaped bearing pedestal supporting the housing.

In a preferably embodiment of the present disclosure, the bearing pedestal is provided below the housing; and the bearing is interposed between the housing and the bearing pedestal.

In a preferably embodiment of the present disclosure, a width of the upper cover is less than a diameter of the cell but larger than $\frac{1}{10}$ of the diameter of the cell.

In a preferably embodiment of the present disclosure, a surface area of the openings on the upper cover in total is approximately $\frac{1}{100}$ to $\frac{1}{2}$ of a cambered surface area of the upper cover.

In another aspect, there is provided an apparatus for vapor deposition, including the assembly for vapor deposition as set forth.

In a preferably embodiment of the present disclosure, the apparatus for vapor deposition further includes a chamber and a fixing device configured to fix the cell; the assembly for vapor deposition is accommodated in the chamber, one end of the fixing device is connected to the cell, and the other end of the fixing device is connected to an inner wall of the chamber through the seal cap to keep the cell immovably fixed.

In a preferably embodiment of the present disclosure, the cell comprises a first joint provided on and protruded from end faces of the cell; the fixing device comprises a second joint on which a recess is formed; and the first joint has a corresponding shape to the recess formed on the second joint.

In a preferably embodiment of the present disclosure, the fixing device is closed with the seal caps.

In a preferably embodiment of the present disclosure, the apparatus for vapor deposition further comprises a blocking device configured to block the air outlets; and the blocking device is accommodated in the chamber and positioned on one side of the assembly for vapor deposition.

In a preferably embodiment of the present disclosure, a plurality of assemblies for vapor deposition and blocking devices are provided, and the number of the assembly for vapor deposition is equal to that of the blocking device.

DETAILED DESCRIPTION OF THE EMBODIMENTS

Embodiments of the present disclosure will be clearly and completely described hereinafter in detail with reference to the accompanying drawings.

Apparently, the embodiments as discussed herein are only one part rather than all of embodiments of the present disclosure. Based on the embodiments in the present disclosure, all other embodiments that can be appreciated by those skilled in the art without any creative labor shall fall within the protection scope of the present disclosure.

The well-known apparatus for vapor deposition includes an assembly for vapor deposition having a housing and a cell for receiving organic materials. The cell is immovably fixed in the housing. In other words, the housing is fixed relative to the cell.

Figure 1:
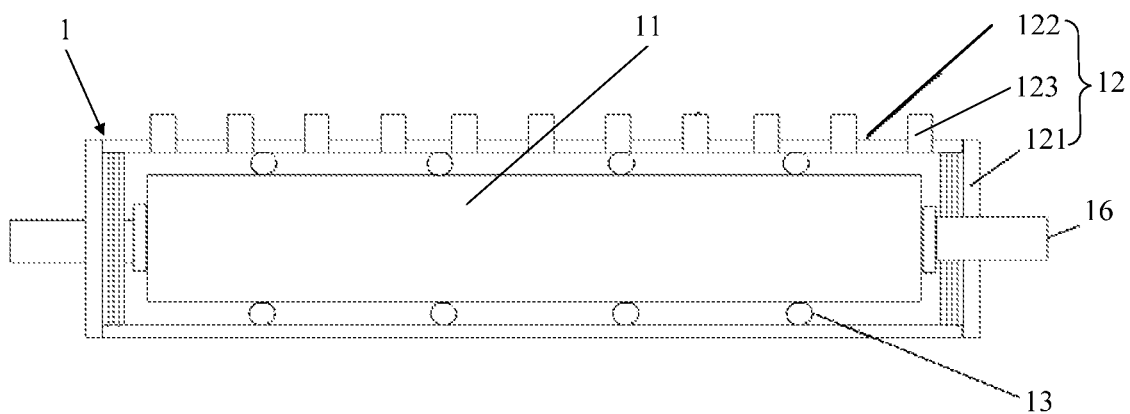
FIG. 1 is a front view of an assembly for vapor deposition according to an embodiment of the present disclosure.
Figure 2:
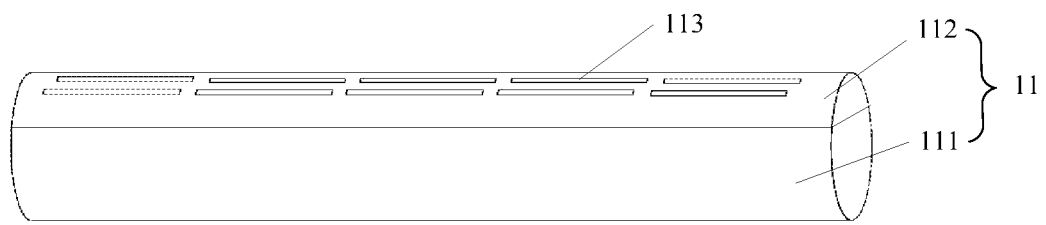
FIG. 2 is a schematic structural view of a cell in the assembly for vapor deposition according to the embodiment of the present disclosure.

In an embodiment of the present disclosure, there is provided an assembly for vapor deposition. Referring to FIGS. 1 and 2, the assembly 1 includes a cell 11 and a housing 12, the housing 12 has a hollow structure; the cell 11 is accommodated in the housing 12. The cell 11 is adapted to receive materials to be vapor-deposited. The materials to be vapor-deposited in a solid state are heated to be melted and volatilized or sublimated into a gaseous state. The housing 12 is capable of rotating relative to the cell 11 to eject and vapor-deposit the materials in the gaseous state onto the substrate. The materials to be vapor-deposited are organic materials in general. The organic materials to be vapor-deposited before being heated are in the solid state, including two types. After being heated, one type is changed from the solid state to a liquid state and then to a gaseous state (i.e., melting and volatilization), while the other is changed from the solid state directly into the gaseous state (i.e. sublimation).

In this embodiment of the present disclosure, the assembly 1 for vapor deposition includes the cell 11 and the housing 12 for receiving the materials to be vapor-deposited, in which the cell 11 is accommodated in the housing 12, the gaseous materials to be vapor-deposited are ejected from the housing 12 and vapor-deposited onto the substrate, and the housing 12 is capable to rotating relative to the cell 11 In this way, a film layer structure may be obtained by controlling an angle of the rotation of the housing 12. When the film layer structure on the substrate varies, the angle of the rotation of the housing 12 can be simply regulated without providing any extra assembly for vapor deposition. Therefore, the assembly 1 according to the present disclosure is conveniently utilized and can reduce the manufacturing cost of display devices.

The well-known cell forms a rectangular parallelepiped shape. The materials to be vapor-deposited in the cell are gradually melted and volatilized or sublimated with the development of the vapor-deposition process, and eventually more materials remain on a bottom wall of the cell. This portion of the materials to be vapor-deposited cannot be effectively volatilized or sublimated but wasted so that the utilization rate is lowered while the manufacturing cost is increased.

In order to address the above problems, the cell 11 is in a cylindrical shape in the embodiment of the present disclosure. The cylindrical cell 11 has an inner wall of cambered surface which forms a smaller contact area with the materials to be vapor-deposited compared to the well-known rectangular parallelepiped cell. Accordingly, less materials to be vapor-deposited would remain on the inner wall, thus reducing waste and improving the utilization rate of the materials to be vapor-deposited.

In particular, as shown in FIG. 2, the cell 11 includes an arc-shaped main body 111 and an upper cover 112. The main body 111 and the upper cover 112 are engaged into a cylindrical shape. The mechanical connection may be employed for the engagement. For example, a slide and a lug may be provided on the main body 111 and the upper cover 112, respectively. As an alternative, the adhesives may be employed for the engagement. The top of the upper cover 112 is provided with a plurality of openings 113. Preferably, the openings 113 may be in a strip shape extending at an interval in an axial direction of the cylindrical cell, as shown in FIG. 2. This can facilitate the rapid ejection of the gaseous materials to be vapor-deposited from the inside of the cell 11.

If the upper cover 112 is positioned excessively higher over the main body 111, the surface area occupied by the openings 113 will be reduced, which adversely affect the ejection of the materials to be vapor-deposited from the cell. Preferably, a width of the upper cover 112 may be smaller than a diameter of the cell but larger than $1/10$ of the diameter of the cell. That is, the upper cover 112 is provided on an upper portion of the cell 11, and the area thereof is not excessively small.

Preferably, a surface area of openings 113 on the upper cover 112 in total would be approximately $1/100$ to $1/2$ of the cambered surface area of the upper cover 112.

In order to restrain a rotation of the cell relative to the housing to realize the precise spraying of the materials to be vapor-deposited, as an alternative, the press-fit may be provided between the cell 11 and the housing 12. In other words, there is no gap provided between the cell 11 and the housing 12. The press fit provides sufficient friction between the cell 11 and the housing 12, facilitating the accurate positioning of an opening of the housing 12 during the vapor deposition. It should be understood that the press fit has no influence on the rotation of the housing 12 relative to the cell 11.

Figure 3:
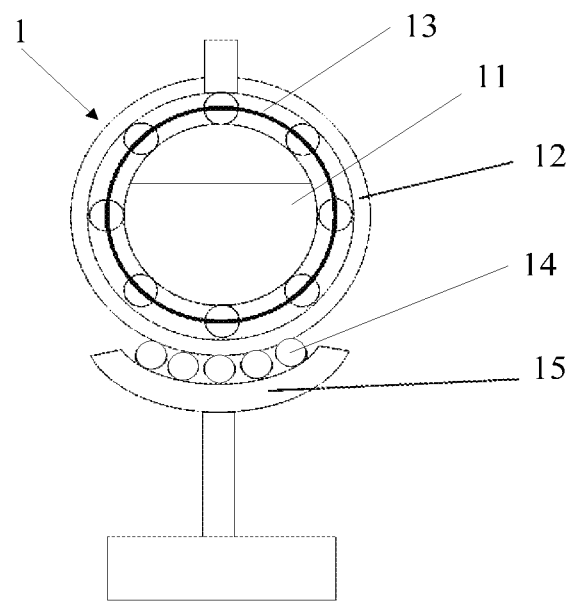
FIG. 3 is a side view of the assembly for vapor deposition according to the embodiment of the present disclosure.

In order to facilitate the rotation of the housing 12 relative to the cell 11 with a reduced friction therebetween and to decrease the wearing of the outer surface of the cell and inner surface of the housing, as shown in FIG. 1 and FIG. 3, as an alternative, the cell and the housing are provided at an interval in a radial direction. In other words, a space is formed between the outer wall of the cell 11 and the inner wall of the housing 12. In this case, a separate caging device (not shown) may be employed for the housing to realize the positioning relative to the cell. The gaseous materials to be vapor-deposited may be filled into the space between the housing 12 and the cell 11.

The assembly 1 for vapor deposition may further include a bearing collar 13 provided in the space between the cell 11 and the housing 12.

As an alternative, at least one bearing collar 13 is provided. Preferably, a plurality of bearing collars 13 may be uniformly provided at an equal interval in the axial direction of the cell 11. For example, a ball bearing may be employed as the bearing collar 13.

It should be noted that, the inner wall of the housing 12 has a circular cross section, and the upper cover 112 and the main body 111 of the cell 11 are closely engaged to form a smooth outer surface (i.e., a smooth cylindrical surface), so that the bearing collar 13 can be easily sleeved outside the cell 11 to facilitate the rotation of the housing 12 relative to the cell 11.

Figure 4:
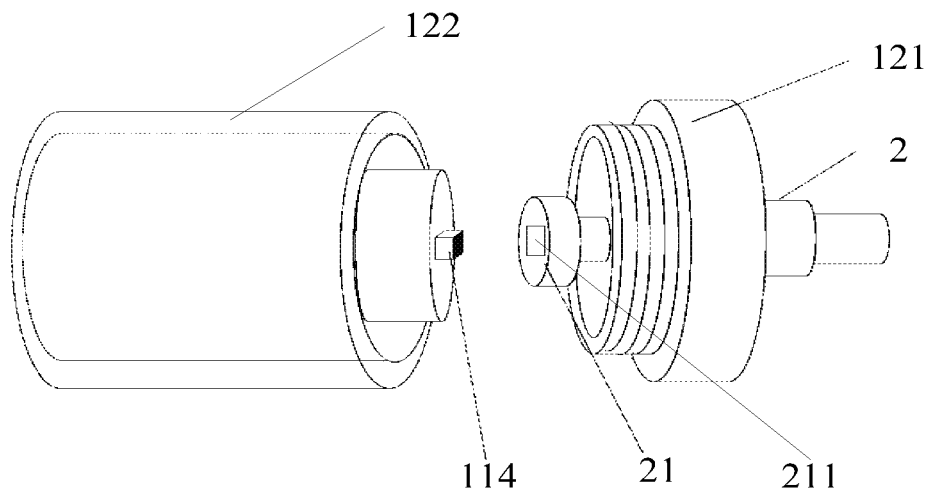
FIG. 4 is a schematic view showing the connection between a housing and the cell according to the embodiment of the present disclosure.

In particular, as shown in FIG. 1 and FIG. 4, the housing 12 is in a cylindrical shape including seal caps 121, a main body portion 122 and a plurality of air outlets 123. Each of air outlets 123 is protruded from the outer sidewall of the main body portion 122 and arranged in an axial direction of the main body portion 122. The seal caps 121 are connected to and close both ends of the main body portion 122.

The main body portion 122 is in a hollow cylindrical shape in which the cell 11 is accommodated, the seal caps 121 are connected to the main body portion 122, the air outlets 123 are communicated with an outer space of the housing 12, and the air outlets 123 are communicated with an inner space of the cell through the openings 113 of the upper cover of the cell 11. The substrate is provided on the outside of the housing 12. The materials to be vapor-deposited within the cell 11 are volatilized or sublimated through the openings 113 on the upper cover of the cell 11 and ejected from the air outlets 123 to form vapor deposition cloud. The cloud is deposited on the substrate to obtain a film layer structure.

It should be noted that the assembly for vapor deposition is a linear evaporation source, in which the air outlets 123 are linearly arranged. The linear evaporation source apparently improves the utilization rate of the organic materials in comparison to the point evaporation source. Further, the large-sized OLED substrate requires higher uniformity of film layer thickness of the vapor-deposited materials. It is easier for the linear evaporation source to provide a uniform film layer thickness in comparison to the point evaporation source.

The cell 11 is necessarily placed into or removed from the inside of the main body portion 122 when the assembly 1 for vapor deposition is being installed or maintained after the completion of vapor deposition. Therefore, optionally, the seal caps 121 can be threaded onto both ends of the main body portion 122. In such a manner, it is convenient to detach the assembly 1, thereby facilitating the installation and subsequent maintenance of the cell 11.

Figure 5:
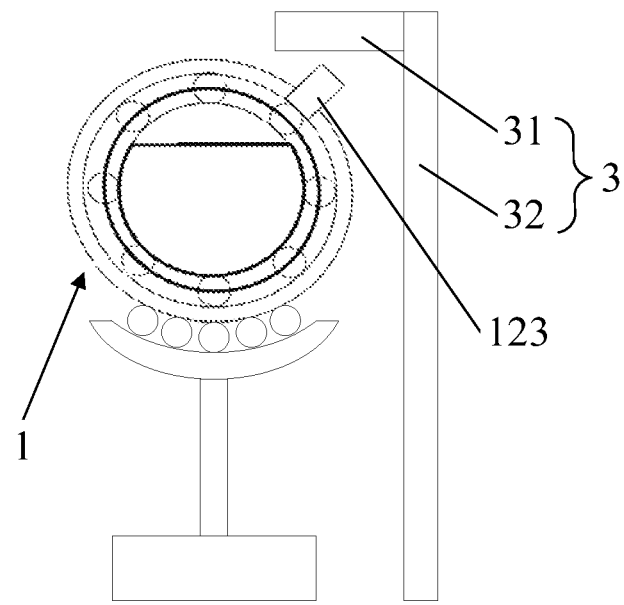
FIG. 5 is a schematic structural view of an apparatus for vapor deposition according to an embodiment of the present disclosure, which is provided with a blocking device.

As shown in FIG. 1 and FIG. 5, the position of the housing 12 when the air outlets 123 are oriented vertically upward is considered as a reference position (i.e., the position as shown in FIG. 1). The housing 12 can rotate by a maximum of 60 degrees from the reference position about its axis. That is, the housing 12 can rotate within a range of ±60 degrees from the reference position. Preferably, the housing 12 can rotate within ±30 degrees from the reference position.

The housing 12 can be connected to a servo motor to realize a bidirectional rotation of the housing 12. The servo motor drives the rotation of the housing 12, in such a manner that the adjustable accuracy for the angle of rotation of the housing 12 can be controlled within 10 degrees.

Further, the assembly 1 for vapor deposition may include a bearing and an arc-shaped bearing pedestal supporting the housing. According to an embodiment of the present disclosure, as shown in FIG. 3, the bearing pedestal 15 is provided below the housing 12, and the bearing 14 is interposed between the housing 12 and the bearing pedestal 15. It should be understood that the bearing pedestal may be provided and support the housing 12 from its side, and the bearings (not shown) may be provided between the bearing pedestal and the housing 12 so as to reduce the friction between the housing and the bearing pedestal. Specifically, the bearing pedestal 15 is also accommodated in the chamber of the apparatus for vapor deposition to carry the assembly 1 for vapor deposition, such that the bearing 14 can reduce the friction between the housing 12 and the bearing pedestal 15 when the housing 12 is rotating.

Usually, the assemblies for vapor deposition are filled with corresponding organic materials according to the design and structure of the OLED device. In the case where the apparatus for vapor deposition includes an assembly for vapor deposition, the materials evaporated and deposited onto the substrate will form a single film layer that is used to form a certain functional layer of the OLED device. In the case where the apparatus for vapor deposition includes a plurality of assemblies for vapor deposition, a composite film layer with a fixed doping ratio will be formed on the substrate.

The inventors have found that if the position of the single layer of the OLED device is changed or the OLED device has a complicated structure including both a single film layer and a composite film layer, then it is required to design a housing with air outlets in different directions to adjust the position of the assembly for vapor deposition according to the structure of the OLED device, or to provide a plurality of assemblies for vapor deposition at different positions to form film layer structures at the respective positions. As such, the well-known assembly for vapor deposition needs to be customized according to the structure of the OLED device. Therefore, the well-known assembly has a small application range and thus the manufacturing cost thereof is increased. Moreover, the well-known apparatus and the assembly for vapor deposition cannot form a mixed film layer having a gradient doping ratio. For this reason, an embodiment of the present disclosure further provides an apparatus for vapor deposition including the assembly 1 for vapor deposition as described above.

The apparatus for vapor deposition according to the present disclosure includes at least one assembly 1 for vapor deposition. The assembly includes a housing 12 and a cell 11 for receiving materials to be vapor-deposited. The cell 11 is accommodated in the housing 12. The materials to be vapor-deposited in a gaseous state are ejected and deposited onto the substrate. The housing 12 is capable of rotating relative to the cell 11. In this manner, a desirable film layer structure can be obtained by controlling the angle of rotation of the housing 12. When the film layer structure on the substrate varies, the angle of rotation of the housing 12 can be simply regulated without providing any extra assembly for vapor deposition. Therefore, the apparatus according to the present disclosure is conveniently utilized and can reduce the manufacturing cost of display devices.

As shown in FIG. 1 and FIG. 4, the apparatus for vapor deposition further includes a chamber (not shown) and a fixing device 2 configured to fix the cell 11. The assembly 1 for vapor deposition is accommodated in the chamber, wherein one end of the fixing device 2 is connected to the cell 11, and the other end thereof is connected to an inner wall of the chamber through the seal cap 121 to keep the cell immovably fixed.

As an alternative, the fixing device 2 may be a connecting rod. As shown in FIG. 4, a first joint 114 is provided at two ends of the cell 11. The first joint 114 is protruded from both end surfaces of the cell 11. A second joint 21 is provided on an end of the fixing device 2 connected to the cell 11. A recess 211 is formed on the second joint 21. The recess has a corresponding shape to the first joint 114. By engaging the first joint 114 with the second joint 21, the fixing device 2 can be connected to the cell 11. The other end of the fixing device 2 is connected to the inner wall of the chamber through the seal cap 121, so as to fix the cell 11 on the inner wall of the chamber. During the vapor deposition, the housing 12 can be rotated, the seal cap 121 can be rotated with the housing 12, and the metal rod can be fixed immovably by connecting to the inner wall of the chamber such that the cell 11 in the housing 12 is controlled to always keep fixed (i.e., the upper cover 112 of the cell 11 is always oriented upward).

To prevent the material to be vapor-deposited in the gaseous state leaking from the assembly 1 for vapor deposition, preferably the fixing device 2 is closed with the seal cap 121. In other words, a seal is provided between the end of the connecting rod passing through the seal cap 121 and the seal cap 121. For example, a seal ring (not shown) may be provided between the connecting rod and the seal cap 121.

Usually, the apparatus for vapor deposition is provided with a cover plate for shielding above the air outlets to control vapor deposition time for the film layer structure. However, there is a gap between the cover plate and the air outlets, so that the evaporated materials may escape from the gap between the cover plate and the air outlets with a poor shielding effect. Moreover, it is necessary to adjust the shielding of the air outlets by the cover plate according to the degree of vapor deposition, which is not convenient in use.

Therefore, as shown in FIG. 5, the apparatus for vapor deposition according to the present disclosure may further includes a blocking device 3 for blocking the air outlets 123. The blocking device 3 is accommodated in the chamber of the apparatus for vapor deposition and positioned on one side of the assembly 1 for vapor deposition (the right side of the assembly 1 for vapor deposition in FIG. 5).

As an alternative, the blocking device 3 may include a horizontal portion 31 and a vertical portion 32 which is perpendicular to the horizontal portion 31, wherein a lower end of the vertical portion 32 is connected to a bottom wall of the chamber, and the horizontal portion 31 is located above the housing 12 without any interference with the air outlets 123 when the housing 12 is rotating.

It should be noted that a length of the horizontal portion 31 and a distance between the blocking device 3 and the assembly 1 for vapor deposition will ensure the normal operation of the housing 12. That is, the horizontal portion 31 cannot shield the air outlets 123 within the range of ±60 degrees from the reference position.

The blocking device 3 can cooperate with the housing 12. The housing 12 can be rotated in a direction where the blocking device 3 is provided when the substrate is not in the process of vapor deposition. For example, the housing is rotated to the maximum angle to conveniently utilize the blocking device 3 to block the gaseous evaporated materials ejecting from the air outlets 123. Optionally, the air outlets 123 can be right oriented to a connecting portion between the horizontal portion 31 and the vertical portion 32, thereby effectively blocking the gaseous evaporated materials and preventing the materials to be vapor-deposited from leaking out with a better shielding effect.

Optionally, the number of the blocking devices 3 is equal to that of assemblies 1 for the vapor deposition. In other words, one assembly 1 for vapor deposition is equipped with one blocking device 3.

Optionally, a plurality of assemblies 1 for vapor deposition and blocking devices 3 may be provided and the assemblies 1 can cooperate in use. In this way, not only a single film layer but also a composite film layer having varying doping ratios can be formed on the substrate. Therefore, the apparatus according to the disclosure may be used in a wide range of applications without customizing specific assemblies for vapor deposition, thereby reducing the manufacturing cost of display devices.

When the assemblies 1 of the apparatus for vapor deposition are utilized in cooperation with each other, film layers having different structures can be formed. For example, as shown in FIG. 6a to FIG. 6c of the Specification, the present disclosure will be described by taking an example in which two assemblies 1 for vapor deposition containing different materials to be vapor-deposited therein are arranged side by side.

Figure 6A:
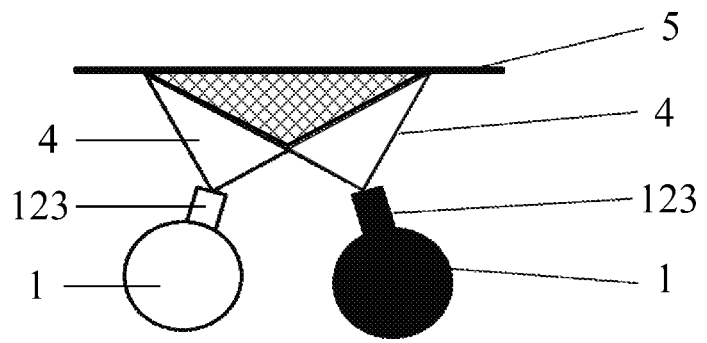
FIG. 6a is a schematic diagram of a working state of the apparatus for vapor deposition according to the embodiment of the present disclosure.

As shown in FIG. 6a, two housings 12 of the assemblies 1 for vapor deposition are deflected toward the middle of the two assemblies 1. Two pieces of vapor deposition cloud 4 can be formed by the gaseous evaporated materials ejected from the air outlets 123 of the two assemblies for vapor deposition. The two pieces of vapor deposition cloud 4 are completely superimposed on the substrate 5 (the superimposed regions are shown by the grid lines), so as to form a composite film layer structure on a corresponding region of the substrate 5.

Figure 6B:
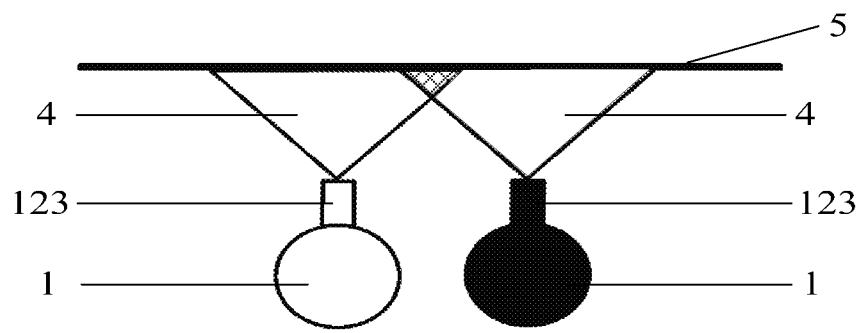
FIG. 6b is a schematic diagram of a working state of the apparatus for vapor deposition according to the embodiment of the present disclosure.

As shown in FIG. 6b, two housings 12 of the assemblies 1 for vapor deposition are right at the reference position (i.e., the housings 12 are not deflected), and two pieces of vapor deposition cloud 4 can be formed by the gaseous evaporated materials ejected from the air outlets 123 of the two assemblies, respectively. The two pieces of vapor deposition cloud 4 are partially superimposed on the substrate 5, so as to form a composite film layer structure on a corresponding superimposed area (i.e., the grid-illustrated area) of the substrate 5 and form respective different single film layer structures on non-superimposed areas.

Figure 6C:
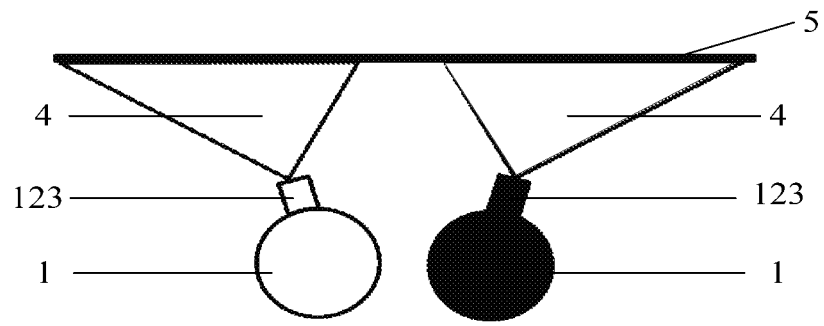
FIG. 6c is a schematic diagram of a working state of the apparatus for vapor deposition according to the embodiment of the present disclosure.

As shown in FIG. 6c, two housings 12 of the assemblies 1 for vapor deposition are deflected in opposite directions, respectively (i.e., deflected towards the outside of the two assemblies 1 for vapor deposition, respectively), and two pieces of vapor deposition cloud 4 are formed by the gaseous evaporated materials ejected from the air outlets 123 of the two assemblies, respectively. The two pieces of vapor deposition cloud 4 are not superimposed on the substrate 5, so as to form respective different single film layer structures on corresponding areas of the substrate 5.

The apparatus for vapor deposition according to the present disclosure may adjust the orientation of the air outlets 123 of each assembly 1 for vapor deposition according to the film structures to be formed on the substrate 5. Therefore, the apparatus for vapor deposition according to the present disclosure is of flexibility and convenience with a wider range of applications.

It should be noted that when a plurality of assemblies 1 for vapor deposition cooperate with each other in the vapor deposition process, the angle of rotation can be adjusted to one or more assemblies 1 for vapor deposition at any time during the vapor deposition, so that a single-layer film structure or multi-layer structure with simple doping concentration can be generated on the substrate 5.

It can be understood that the above embodiments are merely exemplary embodiments provided for illustrating the principle of the present disclosure. However the disclosure is not limited thereto. For those skilled in the art, various modifications and improvements may be made without departing from the spirit and essence of the present disclosure, and these variations and improvements are also considered as the protection scope of the present disclosure.

The invention claimed is:

1. An apparatus for vapor deposition, comprising an assembly for vapor deposition, wherein the assembly for vapor deposition comprises:
   a housing, and
   a cell accommodated in the housing and configured to receive materials to be vapor-deposited;
   wherein the housing is capable of rotating relative to the cell and ejecting the materials to be vapor-deposited in a gaseous state, the housing is in a cylindrical shape, comprising seal caps, a main body portion and a plurality of air outlets; the air outlets direction of the main body portion and the seal caps are connected to and close both ends of the main body portion;
   the apparatus for vapor deposition further comprising:
   a chamber in which the assembly for vapor deposition is accommodated; and
   a fixing device configured to fix the cell, wherein one end of the fixing device is connected to the cell and the other end of the fixing device is connected to an inner wall of the chamber through the seal cap to keep the cell immovably fixed.

2. The apparatus for vapor deposition of claim 1, wherein the cell is in a cylindrical shape.

3. The apparatus for vapor deposition of claim 2, wherein the cell comprises an arc-shaped main body and an upper cover;
   the main body is connected to the upper cover to form the cylindrical shape; and the upper cover is provided with a plurality of openings on its top.

4. The apparatus for vapor deposition of claim 3, wherein an inner wall of the housing has a circular cross section.

5. The apparatus for vapor deposition of claim 4, wherein the cell and the housing are arranged at an interval in a radial direction.

6. The apparatus for vapor deposition of claim 5, wherein the assembly for vapor deposition further comprises a bearing collar provided in the interval between the cell and the housing.

7. The apparatus for vapor deposition of claim 1, wherein the seal caps are threaded to both ends of the main body portion.

8. The apparatus for vapor deposition of claim 7, wherein the housing is capable of rotating by a maximum of 60 degrees from a reference position about its axis; and the reference position is a position of the housing when the air outlets are oriented vertically upward.

9. The apparatus for vapor deposition of claim 7, wherein the assembly for vapor deposition further comprises a bearing and an arc-shaped bearing pedestal supporting the housing.

10. The apparatus for vapor deposition of claim 9, wherein the bearing is provided below the housing; and the bearing is interposed between the housing and the bearing pedestal.

11. The apparatus for vapor deposition of claim 3, wherein a width of the upper cover is larger than $1/10$ of a diameter of the cell but less than the diameter of the cell.

12. The apparatus for vapor deposition of claim 3, wherein a surface area of the openings on the upper cover in total is approximately $1/100$ to $1/2$ of a cambered surface area of the upper cover.

13. The apparatus for vapor deposition of claim 1, wherein the cell comprises a first joint provided on and protruded from end faces of the cell; the fixing device comprises a second joint on which a recess is formed; and the first joint has a corresponding shape to the recess formed on the second joint.

14. The apparatus for vapor deposition of claim 13, wherein the fixing device is closed with the seal caps.

15. The apparatus for vapor deposition of claim 14, further comprising a blocking device configured to block the air outlets; and the blocking device is accommodated in the chamber and positioned on one side of the assembly for vapor deposition.

16. A device for vapor deposition of claim 15, wherein a plurality of assemblies for vapor deposition and blocking devices are provided, and the number of the assembly for vapor deposition is equal to that of the blocking device.

* * * * *